United States Patent
Kim et al.

(10) Patent No.: US 12,339,391 B2
(45) Date of Patent: Jun. 24, 2025

(54) FMCW RADAR TRANSMISSION AND RECEPTION APPARATUS USING PLURALITY OF PLLS

(71) Applicant: Kwangwoon University Industry-Academic Collaboration Foundation, Seoul (KR)

(72) Inventors: Jeong-Geun Kim, Seoul (KR); Dong-Hyun Baek, Seoul (KR); Jeong-Soo Park, Seoul (KR); Ayush Bhatta, Seoul (KR); Keshab Pandey, Seoul (KR); Ganesh Mainali, Seoul (KR)

(73) Assignee: Kwangwoon University Industry-Academic Collaboration Foundation, Seoul (KR)

(*) Notice: Subject to any disclaimer, the term of this patent is extended or adjusted under 35 U.S.C. 154(b) by 418 days.

(21) Appl. No.: 17/786,710

(22) PCT Filed: Dec. 18, 2019

(86) PCT No.: PCT/KR2019/017964
§ 371 (c)(1),
(2) Date: Jun. 17, 2022

(87) PCT Pub. No.: WO2021/125381
PCT Pub. Date: Jun. 24, 2021

(65) Prior Publication Data
US 2023/0021026 A1 Jan. 19, 2023

(30) Foreign Application Priority Data
Dec. 17, 2019 (KR) .......... 10-2019-0168748

(51) Int. Cl.
G01S 7/35 (2006.01)
H03L 7/07 (2006.01)
H03L 7/08 (2006.01)

(52) U.S. Cl.
CPC ........... G01S 7/352 (2013.01); H03L 7/07 (2013.01); H03L 7/08 (2013.01)

(58) Field of Classification Search
CPC ........... G01S 7/352; H03L 7/07; H03L 7/08
See application file for complete search history.

(56) References Cited

U.S. PATENT DOCUMENTS

| | | | |
|---|---|---|---|
| 7,002,511 B1* | 2/2006 | Ammar | G01S 7/032 342/134 |
| 8,072,367 B1* | 12/2011 | Bausov | G01S 13/888 342/21 |
| 2019/0165794 A1* | 5/2019 | Ott | H03L 7/22 |

FOREIGN PATENT DOCUMENTS

KR 101658354 9/2016

* cited by examiner

Primary Examiner — William Kelleher
Assistant Examiner — Nazra Nur Waheed
(74) Attorney, Agent, or Firm — IPLA P.A.

(57) ABSTRACT

An FMCW radar transmission and reception apparatus radiates, via a transmission antenna, a beat frequency signal of a frequency modulation continuous wave (FMCW) and then receives, via a reception antenna, a reflected signal obtained from the radiated frequency modulation continuous wave (FMCW) signal that is reflected by a target and returns, wherein the frequency of a beat signal of a frequency modulation continuous wave (FMCW) radar can be effectively adjusted by configuring a plurality of phase locked loops (PLLs) used in a transmitter and a receiver, and using the same reference oscillation signal for the plurality of PLLs.

3 Claims, 2 Drawing Sheets

FMCW RADAR TRANSMISSION AND RECEPTION APPARATUS USING PLURALITY OF PLLS

BACKGROUND

The present invention relates to an FMCW radar transmission and reception apparatus using a plurality of PLLs, and more particularly, to an FMCW radar transmission and reception apparatus using a plurality of PLLs, which can effectively adjust the frequency of a beat signal of a frequency modulation continuous wave (FMCW) radar by configuring a plurality of phased locked loops (PLLs) employed in a transmitter and a receiver and using the same reference oscillation signal for the plurality of PLLs.

With the spread of Information and Communications Technologies (ICT), researches on Radio Detection AND Ranging (Radar), which radiates electromagnetic waves as a transmission signal, receives reflection waves reflected by a target, and detects the distance, speed, angle, and the like of the target, are actively conducted in relation to 5G and autonomous vehicles.

The radar may be divided into a frequency modulation continuous wave (FMCW) radar and a pulse radar according to the types of transmission signals. Among the radars, the frequency modulation continuous wave (FMCW) radar is spotlighted recently as it simultaneously performs reception and transmission and has an advantage of excellent resolution in a short distance using a linear wave.

However, such a frequency modulation continuous wave (FMCW) radar has a problem in that reception sensitivity is lowered by the effect of 1/f noises caused by the frequency of a low beat signal.

The background art of the present invention is disclosed in Korean Patent Publication No. 10-1658354 filed on Mar. 30, 2016 and published on Sep. 21, 2016.

SUMMARY OF THE INVENTION

Therefore, the present invention has been made in view of the above problems, and it is an object of the present invention to provide an FMCW radar transmission and reception apparatus using a plurality of PLLs, which can effectively adjust the frequency of a beat signal of a frequency modulation continuous wave (FMCW) radar by configuring a plurality of phased locked loops (PLLs) employed in a transmitter and a receiver and using the same reference oscillation signal for the plurality of PLLs.

The present invention is not limited to the problems mentioned above, and unmentioned other problems will be clearly understood by those skilled in the art from the following descriptions.

To accomplish the above object, according to one aspect of the present invention, there is provided an FMCW radar transmission and reception apparatus using a plurality of PLLs, which receives, after radiating a beat frequency signal of a frequency modulation continuous wave (FMCW) via a transmission antenna, a reflection signal of the radiated frequency modulation continuous wave (FMCW) signal reflected by a target and returned through a reception antenna, the apparatus comprising: a 11-th transmission PLL including a 11-th FMCW modulation unit for receiving a reference oscillation signal provided by a reference oscillator (Temperature Compensated Crystal Oscillator, TCXO) and performing FMCW modulation, a 11-th phase/frequency detection unit for detecting the phase and frequency of the frequency modulation continuous wave signal provided by the 11-th FMCW modulation unit, a 11-th charge pump unit for receiving the phase and frequency provided by the 11-th phase/frequency detection unit and generating a frequency control voltage, a 11-th loop filter for transferring the frequency control voltage provided by the 11-th charge pump unit, a 11-th voltage control oscillator for generating a voltage control oscillation signal using the frequency control voltage transferred through the 11-th loop filter, and a 11-th frequency divider for dividing the frequency of the voltage control oscillation signal provided by the 11-th voltage control oscillator and transferring a divided frequency to the 11-th phase/frequency detection unit; a 12-th local PLL including a 12-th FMCW modulation unit for receiving a reference oscillation signal provided by the reference oscillator (Temperature Compensated Crystal Oscillator, TCXO) and performing FMCW modulation, a 12-th phase/frequency detection unit for detecting the phase and frequency of the frequency modulation continuous wave signal provided by the 12-th FMCW modulation unit, a 12-th charge pump unit for receiving the phase and frequency provided by the 12-th phase/frequency detection unit and generating a frequency control voltage, a 12-th loop filter for transferring the frequency control voltage provided by the 12-th charge pump unit, a 12-th voltage control oscillator for generating a voltage control oscillation signal using the frequency control voltage transferred through the 12-th loop filter, and a 12-th frequency divider for dividing the frequency of the voltage control oscillation signal provided by the 12-th voltage control oscillator and transferring a divided frequency to the 12-th phase/frequency detection unit; and a reception unit for providing a reception signal, which is reflected after the beat frequency signal of a frequency modulation continuous wave (FMCW) provided by the 11-th transmission PLL is radiated via a transmission antenna, as an I signal and a Q signal, wherein the reception unit receives the voltage control oscillation signal provided by the 12-th local PLL, and provides the I signal and the Q signal.

In the FMCW radar transmission and reception apparatus using a plurality of PLLs according to an embodiment of the present invention, the 12-th local PLL further includes a 12-th delay unit for delaying the reference oscillation signal provided by the reference oscillator and transferring a delayed reference oscillation signal to the 12-th FMCW modulation unit.

To accomplish the above object, according to another aspect of the present invention, there is provided an FMCW radar transmission and reception apparatus using a plurality of PLLs, which receives, after radiating a beat frequency signal of a frequency modulation continuous wave (FMCW) via a transmission antenna, a reflection signal of the radiated frequency modulation continuous wave (FMCW) signal reflected by a target and returned through a reception antenna, the apparatus comprising: a 11-th transmission PLL including a 11-th FMCW modulation unit for receiving a reference oscillation signal provided by a reference oscillator (Temperature Compensated Crystal Oscillator, TCXO) and performing FMCW modulation, a 11-th phase/frequency detection unit for detecting the phase and frequency of the frequency modulation continuous wave signal provided by the 11-th FMCW modulation unit, a 11-th charge pump unit for receiving the phase and frequency provided by the 11-th phase/frequency detection unit and generating a frequency control voltage, a 11-th loop filter for transferring the frequency control voltage provided by the 11-th charge pump unit, a 11-th voltage control oscillator for generating a voltage control oscillation signal using the frequency control voltage transferred through the 11-th loop filter, and a 11-th frequency divider for dividing the frequency of the voltage control oscillation signal provided by the 11-th voltage control oscillator and transferring a divided frequency to the 11-th phase/frequency detection unit; a 12-th local PLL including a 12-th FMCW modulation unit for receiving a reference oscillation signal provided by the reference oscillator (Temperature Compensated Crystal Oscillator, TCXO) and performing FMCW modulation, a 12-th phase/frequency detection unit for detecting the phase and frequency of the frequency modulation continuous wave signal provided by the 12-th FMCW modulation unit, a 12-th charge pump unit for receiving the phase and frequency provided by the 12-th phase/frequency detection unit and generating a frequency control voltage, a 12-th loop filter for transferring the frequency control voltage provided by the 12-th charge pump unit, a 12-th voltage control oscillator for generating a voltage control oscillation signal using the frequency control voltage transferred through the 12-th loop filter, and a 12-th frequency divider for dividing the frequency of the voltage control oscillation signal provided by the 12-th voltage control oscillator and transferring a divided frequency to the 12-th phase/frequency detection unit; a 21-th transmission PLL including a 21-th FMCW modulation unit for receiving a reference oscillation signal provided by a reference oscillator (Temperature Compensated Crystal Oscillator, TCXO) and performing FMCW modulation, a 21-th phase/frequency detection unit for detecting the phase and frequency of the frequency modulation continuous wave signal provided by the 21-th FMCW modulation unit, a 21-th charge pump unit for receiving the phase and frequency provided by the 21-th phase/frequency detection unit and generating a frequency control voltage, a 21-th loop filter for transferring the frequency control voltage provided by the 21-th charge pump unit, a 21-th voltage control oscillator for generating a voltage control oscillation signal using the frequency control voltage transferred through the 21-th loop filter, and a 21-th frequency divider for dividing the frequency of the voltage control oscillation signal provided by the 21-th voltage control oscillator and transferring a divided frequency to the 21-th phase/frequency detection unit; a 22-th local PLL including a 22-th FMCW modulation unit for receiving a reference oscillation signal provided by the reference oscillator (Temperature Compensated Crystal Oscillator, TCXO) and performing FMCW modulation, a 22-th phase/frequency detection unit for detecting the phase and frequency of the frequency modulation continuous wave signal provided by the 22-th FMCW modulation unit, a 22-th charge pump unit for receiving the phase and frequency provided by the 22-th phase/frequency detection unit and generating a frequency control voltage, a 22-th loop filter for transferring the frequency control voltage provided by the 22-th charge pump unit, a 22-th voltage control oscillator for generating a voltage control oscillation signal using the frequency control voltage transferred through the 22-th loop filter, and a 22-th frequency divider for dividing the frequency of the voltage control oscillation signal provided by the 22-th voltage control oscillator and transferring a divided frequency to the 22-th phase/frequency detection unit; and a reception unit for providing a reception signal, which is reflected after the beat frequency signal of a frequency modulation continuous wave (FMCW) provided by the 11-th transmission PLL is radiated via a transmission antenna, as a Q signal, or providing a reception signal, which is reflected after the beat frequency signal of a frequency modulation continuous wave (FMCW) provided by the 21-th transmission PLL is radiated via a transmission antenna, as an I signal and a Q signal, wherein the reception unit receives the voltage control oscillation signal provided by the 12-th local PLL, and provides the I signal and the Q signal, or receives the voltage control oscillation signal provided by the 22-th local PLL, and provides the I signal and the Q signal.

In the FMCW radar transmission and reception apparatus using a plurality of PLLs according to an embodiment of the present invention, the 12-th local PLL further includes a 12-th delay unit for delaying the reference oscillation signal provided by the reference oscillator and transferring a delayed reference oscillation signal to the 12-th FMCW modulation unit.

In the FMCW radar transmission and reception apparatus using a plurality of PLLs according to an embodiment of the present invention, wherein the 22-th local PLL further includes a 22-th delay unit for delaying the reference oscillation signal provided by the reference oscillator and transferring a delayed reference oscillation signal to the 22-th FMCW modulation unit.

The FMCW radar transmission and reception apparatus using a plurality of PLLs according to the embodiments of the present invention may effectively improve reception sensitivity by finely adjusting the frequency of a beat signal of a frequency modulation continuous wave (FMCW) radar by configuring a plurality of phased locked loops (PLLs) employed in a transmitter and a receiver and using the same reference oscillation signal for the plurality of PLLs.

DETAILED DESCRIPTION OF THE INVENTION

Figure 1:
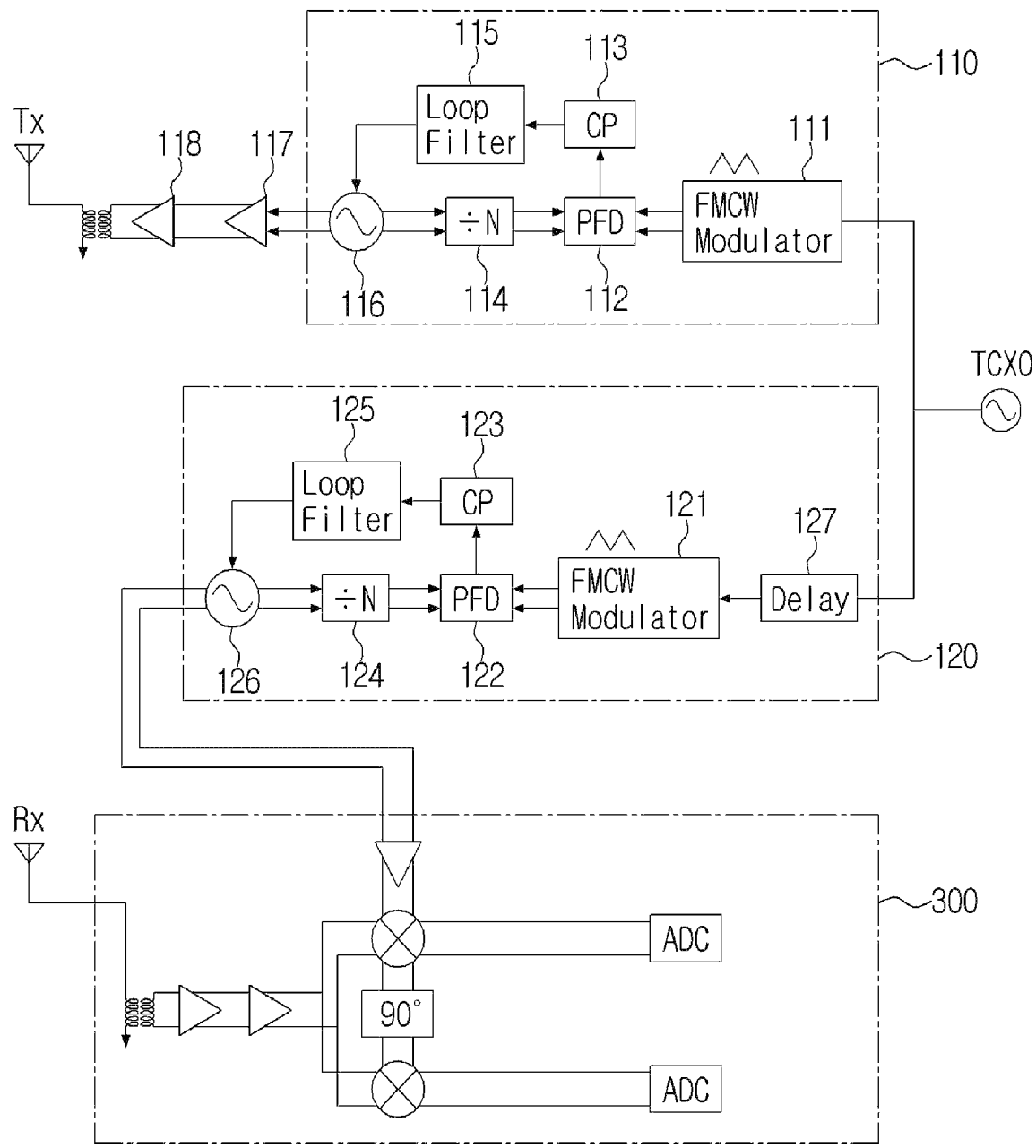
FIG. 1 is a circuit diagram showing an FMCW radar transmission and reception apparatus using a plurality of PLLs according to an embodiment of the present invention.

Detailed description of the present invention described below is an example of a specific embodiment that the present invention may be embodied, and reference is made to the accompanying drawings. These embodiments are described in detail as sufficient as to allow those skilled in the art to practice the present invention. It should be understood that although various embodiments of the present invention are different from each other, they do not need to be mutually exclusive. For example, specific shapes, structures, and features described herein may be implemented in other embodiments without being departed from the spirit and scope of the present invention with respect to an embodiment. In addition, it should be understood that the location or arrangement of individual components within each disclosed embodiment may be changed without being departed from the spirit and scope of the present invention.

Accordingly, the detailed description described below is not intended to be taken in a limiting sense, and the scope of the present invention, if properly described, is limited only by the appended claims, together with all the scope that is equivalents to the matters claimed.

In the drawings, like reference numerals refer to like or similar functions in various aspects, and the length, area, thickness, and the like may be exaggerated for convenience.

Figure 2:
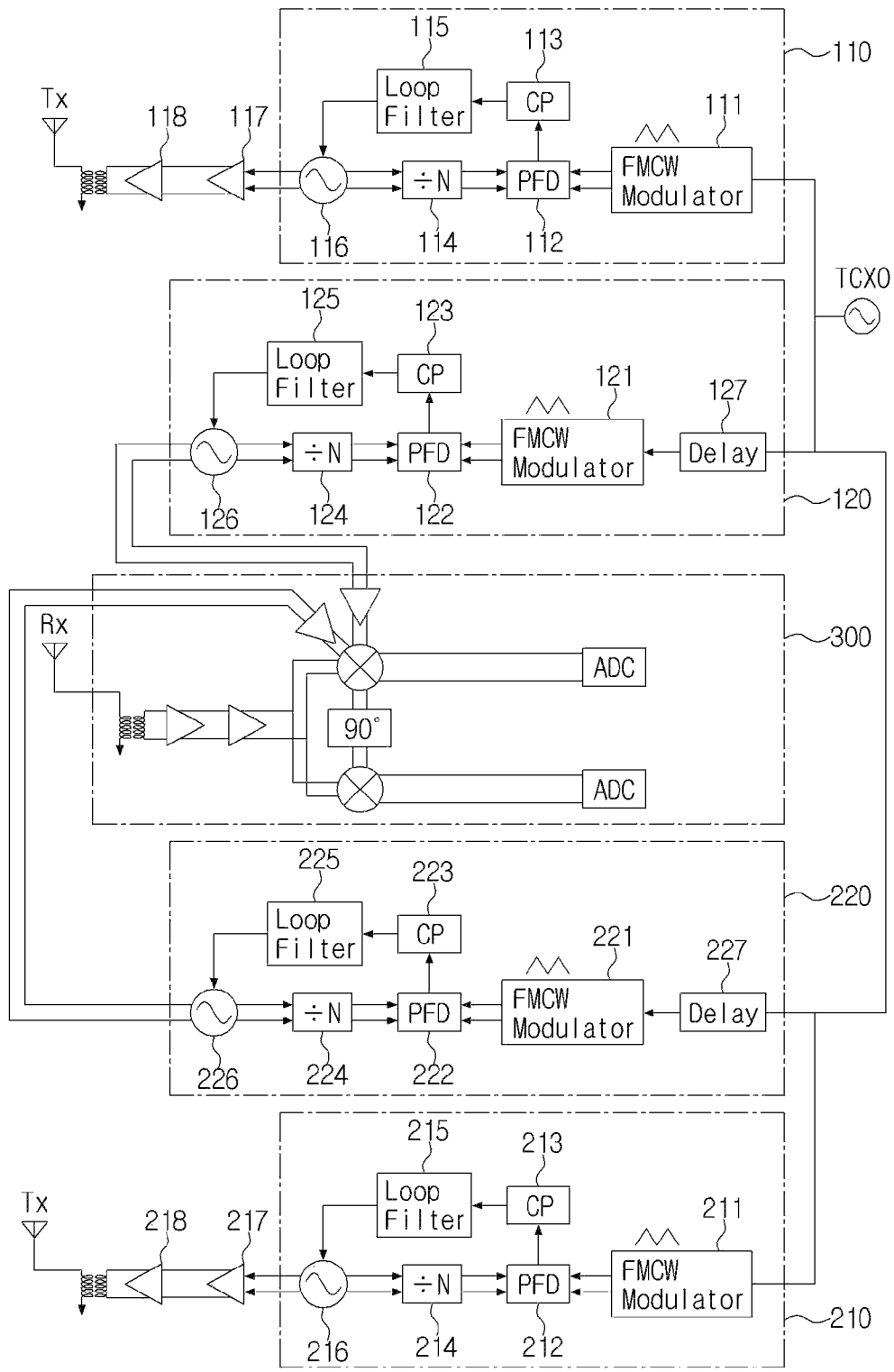
FIG. 2 is a circuit diagram showing an FMCW radar transmission and reception apparatus using a plurality of PLLs according to another embodiment of the present invention.

FIG. 1 is a circuit diagram showing an FMCW radar transmission and reception apparatus using a plurality of PLLs according to an embodiment of the present invention, and FIG. 2 is a circuit diagram showing an FMCW radar transmission and reception apparatus using a plurality of PLLs according to another embodiment of the present invention.

As shown in FIG. 1, an FMCW radar transmission and reception apparatus using a plurality of PLLs according to an embodiment of the present invention may include a 11-th transmission PLL 110, a 12-th local PLL 120, and a reception unit 300.

As shown in FIG. 1, the 11-th transmission PLL 110 includes a 11-th FMCW modulation unit 111 for receiving a reference oscillation signal provided by a reference oscillator (Temperature Compensated Crystal Oscillator, TCXO) and performing FMCW modulation; a 11-th phase/frequency detection unit 112 for detecting the phase and frequency of the frequency modulation continuous wave signal provided by the 11-th FMCW modulation unit 111; a 11-th charge pump unit 113 for receiving the phase and frequency provided by the 11-th phase/frequency detection unit 112 and generating a frequency control voltage; a 11-th loop filter 115 for transferring the frequency control voltage provided by the 11-th charge pump unit 113; a 11-th voltage control oscillator 116 for generating a voltage control oscillation signal using the frequency control voltage transferred through the 11-th loop filter 115; and a 11-th frequency divider 114 for dividing the frequency of the voltage control oscillation signal provided by the 11-th voltage control oscillator 116 and transferring a divided frequency to the 11-th phase/frequency detection unit 112.

As shown in FIG. 1, the 12-th local PLL 120 includes a 12-th FMCW modulation unit 121 for receiving a reference oscillation signal provided by the reference oscillator (Temperature Compensated Crystal Oscillator, TCXO) and performing FMCW modulation; a 12-th phase/frequency detection unit 122 for detecting the phase and frequency of the frequency modulation continuous wave signal provided by the 12-th FMCW modulation unit 121; a 12-th charge pump unit 123 for receiving the phase and frequency provided by the 12-th phase/frequency detection unit 122 and generating a frequency control voltage; a 12-th loop filter 125 for transferring the frequency control voltage provided by the 12-th charge pump unit 123; a 12-th voltage control oscillator 126 for generating a voltage control oscillation signal using the frequency control voltage transferred through the 12-th loop filter 125; and a 12-th frequency divider 124 for dividing the frequency of the voltage control oscillation signal provided by the 12-th voltage control oscillator 126 and transferring a divided frequency to the 12-th phase/frequency detection unit 122.

In addition, as shown in FIG. 1, the reception unit 300 receives a signal, which is reflected after a beat frequency signal of a frequency modulation continuous wave (FMCW) provided by the 11-th transmission PLL 110 passes through the power amplifiers 117 and 118 and is radiated via a transmission antenna, and the voltage control oscillation signal provided by the 12-th local PLL 120, and provides the signals as an I signal and a Q signal.

The FMCW radar transmission and reception apparatus using a plurality of PLLs according to an embodiment of the present invention may effectively adjust the frequency of a beat signal by including a 11-th transmission PLL 110 and a 12-th local PLL 120, synchronizing the 11-th transmission PLL 110 and the 12-th local PLL 120 by applying the same reference oscillation signal, and transferring the voltage control oscillation signal provided by the 12-th local PLL 120 to the reception unit 300.

Meanwhile, the 12-th local PLL 120 of the FMCW radar transmission and reception apparatus using a plurality of PLLs according to an embodiment of the present invention may further include a 12-th delay unit 127 for delaying the reference oscillation signal provided by the reference oscillator TCXO within a predetermined range and transferring a delayed reference oscillation signal to the 12-th FMCW modulation unit 121.

Here, since the FMCW radar transmission and reception apparatus using a plurality of PLLs according to an embodiment of the present invention may finely adjust the frequency of the beat signal when the 12-th delay unit 127 is further included in the 12-th local PLL 120, the reception sensitivity may be improved more effectively.

Hereinafter, the FMCW radar transmission and reception apparatus using a plurality of PLLs according to an embodiment of the present invention will be described with reference to FIG. 2.

An FMCW radar transmission and reception apparatus using a plurality of PLLs according to another embodiment of the present invention may include a 11-th transmission PLL 110, a 12-th local PLL 120, a 21-th transmission PLL 210, a 22-th local PLL 220, and a reception unit 300.

As shown in FIG. 2, the 11-th transmission PLL 110 includes a 11-th FMCW modulation unit 111 for receiving a reference oscillation signal provided by a reference oscillator (Temperature Compensated Crystal Oscillator, TCXO) and performing FMCW modulation; a 11-th phase/frequency detection unit 112 for detecting the phase and frequency of the frequency modulation continuous wave signal provided by the 11-th FMCW modulation unit 111; a 11-th charge pump unit 113 for receiving the phase and frequency provided by the 11-th phase/frequency detection unit 112 and generating a frequency control voltage; a 11-th loop filter 115 for transferring the frequency control voltage provided by the 11-th charge pump unit 113; a 11-th voltage control oscillator 116 for generating a voltage control oscillation signal using the frequency control voltage transferred through the 11-th loop filter 115; and a 11-th frequency divider 114 for dividing the frequency of the voltage control oscillation signal provided by the 11-th voltage control oscillator 116 and transferring a divided frequency to the 11-th phase/frequency detection unit 112.

Meanwhile, as shown in FIG. 2, the 12-th local PLL 120 includes a 12-th FMCW modulation unit 121 for receiving a reference oscillation signal provided by the reference oscillator (Temperature Compensated Crystal Oscillator, TCXO) and performing FMCW modulation; a 12-th phase/frequency detection unit 122 for detecting the phase and frequency of the frequency modulation continuous wave signal provided by the 12-th FMCW modulation unit 121; a 12-th charge pump unit 123 for receiving the phase and frequency provided by the 12-th phase/frequency detection unit 122 and generating a frequency control voltage; a 12-th loop filter 125 for transferring the frequency control voltage provided by the 12-th charge pump unit 123; a 12-th voltage control oscillator 126 for generating a voltage control oscillation signal using the frequency control voltage transferred through the 12-th loop filter 125; and a 12-th frequency divider 124 for dividing the frequency of the voltage control oscillation signal provided by the 12-th voltage control oscillator 126 and transferring a divided frequency to the 12-th phase/frequency detection unit 122.

Meanwhile, as shown in FIG. 2, the 21-th transmission PLL 210 includes a 21-th FMCW modulation unit 211 for receiving a reference oscillation signal provided by a reference oscillator (Temperature Compensated Crystal Oscillator, TCXO) and performing FMCW modulation; a 21-th phase/frequency detection unit 212 for detecting the phase and frequency of the frequency modulation continuous wave signal provided by the 21-th FMCW modulation unit 211; a 21-th charge pump unit 213 for receiving the phase and frequency provided by the 21-th phase/frequency detection unit 212 and generating a frequency control voltage; a 21-th loop filter 215 for transferring the frequency control voltage provided by the 21-th charge pump unit 213; a 21-th voltage control oscillator 216 for generating a voltage control oscillation signal using the frequency control voltage transferred through the 21-th loop filter 215; and a 21-th frequency divider 214 for dividing the frequency of the voltage control oscillation signal provided by the 21-th voltage control oscillator 216 and transferring a divided frequency to the 21-th phase/frequency detection unit 212.

Meanwhile, as shown in FIG. 2, the 22-th local PLL 220 includes a 22-th FMCW modulation unit 221 for receiving a reference oscillation signal provided by the reference oscillator (Temperature Compensated Crystal Oscillator, TCXO) and performing FMCW modulation; a 22-th phase/frequency detection unit 222 for detecting the phase and frequency of the frequency modulation continuous wave signal provided by the 22-th FMCW modulation unit 221; a 22-th charge pump unit 223 for receiving the phase and frequency provided by the 22-th phase/frequency detection unit 222 and generating a frequency control voltage; a 22-th loop filter 225 for transferring the frequency control voltage provided by the 22-th charge pump unit 223; a 22-th voltage control oscillator 226 for generating a voltage control oscillation signal using the frequency control voltage transferred through the 22-th loop filter 225; and a 22-th frequency divider 224 for dividing the frequency of the voltage control oscillation signal provided by the 22-th voltage control oscillator 226 and transferring a divided frequency to the 22-th phase/frequency detection unit 222.

In addition, as shown in FIG. 2, the reception unit 300 receives a signal, which is reflected after a beat frequency signal of a frequency modulation continuous wave (FMCW) provided by the 11-th transmission PLL 110 passes through the power amplifiers 117 and 118 and is radiated via a transmission antenna, and the voltage control oscillation signal provided by the 12-th local PLL 120, and provides the signals as an I signal and a Q signal, or receives a signal, which is reflected after a beat frequency signal of a frequency modulation continuous wave (FMCW) provided by the 21-th transmission PLL 210 passes through the power amplifiers 217 and 218 and is radiated via a transmission antenna, and the voltage control oscillation signal provided by the 22-th local PLL 220, and provides the signals as an I signal and a Q signal.

The FMCW radar transmission and reception apparatus using a plurality of PLLs according to another embodiment of the present invention may effectively adjust the frequency of a beat signal by including a 11-th transmission PLL 110 and a 12-th local PLL 120, synchronizing the 11-th transmission PLL 110 and the 12-th local PLL 120 by applying the same reference oscillation signal, and transferring the voltage control oscillation signal provided by the 12-th local PLL 120 to the reception unit 300, or including a 21-th transmission PLL 210 and a 22-th local PLL 220, synchronizing the 21-th transmission PLL 210 and the 22-th local PLL 220 by applying the same reference oscillation signal, and transferring the voltage control oscillation signal provided by the 22-th local PLL 220 to the reception unit 300.

Meanwhile, the FMCW radar transmission and reception apparatus using a plurality of PLLs according to another embodiment of the present invention does not necessarily need to be configured of two transmission PLLs and two local PLLs, and it may be changed according to the purpose of using the system which employs the FMCW radar transmission and reception apparatus.

Here, the 12-th local PLL 120 of the FMCW radar transmission and reception apparatus using a plurality of PLLs according to another embodiment of the present invention may further include a 12-th delay unit 127 for delaying the reference oscillation signal provided by the reference oscillator TCXO within a predetermined range and transferring the reference oscillation signal to the 12-th FMCW modulation unit 121, or the 22-th local PLL 220 may further include a 22-th delay unit 227 for delaying the reference oscillation signal provided by the reference oscillator TCXO within a predetermined range and transferring the reference oscillation signal to the 22-th FMCW modulation unit 221.

Since the FMCW radar transmission and reception apparatus using a plurality of PLLs according to another embodiment of the present invention may finely adjust the frequency of the beat signal when the 12-th delay unit 127 is further included in the 12-th local PLL 120 or when the 22-th delay unit 227 is further included in the 22-th local PLL 220, the reception sensitivity may be improved more effectively.

While the present invention has been described and illustrated in connection with preferred embodiments for exemplifying the principles of the present invention, the present invention is not limited to the configurations and operations as shown and described above.

Rather, it will be apparent to those skilled in the art that many changes and modifications can be made to the present invention without departing from the spirit and scope of the appended claims.

Accordingly, all such proper changes, modifications, and equivalents should be considered as falling within the scope of the present invention.

The invention claimed is:

1. A frequency modulation continuous wave (FMCW) radar transmission and reception apparatus using a plurality of PLLs, which receives, after radiating a beat frequency signal of a FMCW via a transmission antenna, a reflection signal of the radiated FMCW reflected by a target and returned through a reception antenna, the apparatus comprising:

a 11-th transmission PLL including a 11-th FMCW modulation unit for receiving a reference oscillation signal provided by a reference oscillator and performing FMCW modulation, a 11-th phase/frequency detection unit for detecting the phase and frequency of a frequency modulation continuous wave provided by the 11-th FMCW modulation unit, a 11-th charge pump unit for receiving the phase and frequency provided by the 11-th phase/frequency detection unit and generating a frequency control voltage, a 11-th loop filter for transferring the frequency control voltage provided by the 11-th charge pump unit, a 11-th voltage control oscillator for generating a voltage control oscillation signal using the frequency control voltage transferred through the 11-th loop filter, and a 11-th frequency divider for dividing the frequency of the voltage control oscillation signal provided by the 11-th voltage control oscillator and transferring a divided frequency to the 11-th phase/frequency detection unit;

a 12-th local PLL including a 12-th FMCW modulation unit for receiving a reference oscillation signal provided by the reference oscillator and performing FMCW modulation, a 12-th phase/frequency detection unit for detecting the phase and frequency of a frequency modulation continuous wave provided by the 12-th FMCW modulation unit, a 12-th charge pump unit for receiving the phase and frequency provided by the 12-th phase/frequency detection unit and generating a frequency control voltage, a 12-th loop filter for transferring the frequency control voltage provided by the 12-th charge pump unit, a 12-th voltage control oscillator for generating a voltage control oscillation signal using the frequency control voltage transferred through the 12-th loop filter, and a 12-th frequency divider for dividing the frequency of the voltage control oscillation signal provided by the 12-th voltage control oscillator and transferring a divided frequency to the 12-th phase/frequency detection unit;

a 21-th transmission PLL including a 21-th FMCW modulation unit for receiving a reference oscillation signal provided by a reference oscillator and performing FMCW modulation, a 21-th phase/frequency detection unit for detecting the phase and frequency of a frequency modulation continuous wave provided by the 21-th FMCW modulation unit, a 21-th charge pump unit for receiving the phase and frequency provided by the 21-th phase/frequency detection unit and generating a frequency control voltage, a 21-th loop filter for transferring the frequency control voltage provided by the 21-th charge pump unit, a 21-th voltage control oscillator for generating a voltage control oscillation signal using the frequency control voltage transferred through the 21-th loop filter, and a 21-th frequency divider for dividing the frequency of the voltage control oscillation signal provided by the 21-th voltage control oscillator and transferring a divided frequency to the 21-th phase/frequency detection unit;

a 22-th local PLL including a 22-th FMCW modulation unit for receiving a reference oscillation signal provided by the reference oscillator and performing FMCW modulation, a 22-th phase/frequency detection unit for detecting the phase and frequency of a frequency modulation continuous wave provided by the 22-th FMCW modulation unit, a 22-th charge pump unit for receiving the phase and frequency provided by the 22-th phase/frequency detection unit and generating a frequency control voltage, a 22-th loop filter for transferring the frequency control voltage provided by the 22-th charge pump unit, a 22-th voltage control oscillator for generating a voltage control oscillation signal using the frequency control voltage transferred through the 22-th loop filter, and a 22-th frequency divider for dividing the frequency of the voltage control oscillation signal provided by the 22-th voltage control oscillator and transferring a divided frequency to the 22-th phase/frequency detection unit; and a reception unit for providing a reception signal, which is reflected after the beat frequency signal of the FMCW provided by the 11-th transmission PLL is radiated via a transmission antenna, as a Q signal, or providing a reception signal, which is reflected after the beat frequency signal of the FMCW provided by the 21-th transmission PLL is radiated via a transmission antenna, as an I signal and a Q signal, wherein the reception unit receives the voltage control oscillation signal provided by the 12-th local PLL, and provides the I signal and the Q signal, or receives the voltage control oscillation signal provided by the 22-th local PLL, and provides the I signal and the Q signal, wherein the reference oscillation signal provided by the reference oscillator is transmitted equally to each of the transmission PLLs and each of the local PLLs, thereby finely adjusting the beat frequency signal of each of the FMCWs.

2. The apparatus according to claim 1, wherein the 12-th local PLL further includes a 12-th delay unit for delaying the reference oscillation signal provided by the reference oscillator and transferring a delayed reference oscillation signal to the 12-th FMCW modulation unit.

3. The apparatus according to claim 1, wherein the 22-th local PLL further includes a 22-th delay unit for delaying the reference oscillation signal provided by the reference oscillator and transferring a delayed reference oscillation signal to the 22-th FMCW modulation unit.

* * * * *